US009843338B1

(12) United States Patent
Newlin

(10) Patent No.: US 9,843,338 B1
(45) Date of Patent: Dec. 12, 2017

(54) RESISTOR-BASED CONFIGURATION SYSTEM

(71) Applicant: Silanna Asia Pte Ltd, Singapore (SG)

(72) Inventor: Trevor M. Newlin, Holly Springs, NC (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 15/464,322

(22) Filed: Mar. 20, 2017

(51) Int. Cl.
*H03M 1/10* (2006.01)
*H03F 3/45* (2006.01)

(52) U.S. Cl.
CPC ............ *H03M 1/1071* (2013.01); *H03F 3/45* (2013.01)

(58) Field of Classification Search
CPC ........ H03M 1/66; H03M 1/1019; H03M 1/46; H03M 1/1071; H03M 1/108; H03M 1/1047; H03M 1/06; H03M 1/1014; H03M 1/80; H03M 1/365; H03M 1/68; H03M 1/682; H03M 1/687; H03M 1/747; H03M 1/765
USPC .......................... 341/118–121, 155, 144, 153
See application file for complete search history.

(56) References Cited

U.S. PATENT DOCUMENTS

| 4,604,692 | A | | 8/1986 | Murakami | |
|---|---|---|---|---|---|
| 5,621,406 | A | * | 4/1997 | Goetzinger | ......... H03M 1/1009 341/118 |
| 5,764,173 | A | * | 6/1998 | Flynn | ................... H03M 1/664 341/144 |
| 5,774,733 | A | | 6/1998 | Nolan et al. | |
| 6,970,794 | B2 | | 11/2005 | Sutardja | |
| 7,332,904 | B1 | * | 2/2008 | Menkus | ............. H03K 19/0005 257/48 |
| 7,512,504 | B2 | | 3/2009 | Sutardja | |
| 7,656,127 | B1 | | 2/2010 | Shutt et al. | |
| 7,724,167 | B2 | | 5/2010 | Buehler et al. | |
| 7,958,286 | B2 | | 6/2011 | Bresemann et al. | |
| 8,018,367 | B2 | | 9/2011 | Cheung et al. | |
| 8,786,482 | B1 | | 7/2014 | Bartel et al. | |
| 9,214,950 | B1 | * | 12/2015 | Davis | .................. H03M 1/0621 |
| 2006/0158360 | A1 | * | 7/2006 | Briaire | ................ H03M 1/1057 341/144 |

(Continued)

OTHER PUBLICATIONS

AS3693B-16 Datasheet, ams AG, Unterpremstaetten, Austria, Sep. 30, 2011.

*Primary Examiner* — Linh Nguyen
(74) *Attorney, Agent, or Firm* — The Mueller Law Office, P.C.

(57) ABSTRACT

A configuration circuit for obtaining a digital code includes a controller circuit that generates a plurality of multibit control words. A digitally controlled current source circuit receives a multibit control word generated by the controller circuit. The digitally controlled current source circuit generates an output current that corresponds to the multibit control word in accordance with a predetermined output curve. A test voltage node receives the output current, and a test voltage develops in response to the output current. A reference voltage node develops a reference voltage, the level of which is independent of the multibit control word. A voltage comparison circuit (i) receives the test voltage and the reference voltage, (ii) compares the two voltages to produce a comparison result and (iii) sends the comparison result to the controller circuit. The digital code is obtained by the configuration circuit using the comparison result and the multibit control word.

23 Claims, 13 Drawing Sheets

(56) References Cited

U.S. PATENT DOCUMENTS

| | | | | |
|---|---|---|---|---|
| 2008/0252504 | A1* | 10/2008 | Jeong | G09G 3/3685 341/144 |
| 2010/0164765 | A1* | 7/2010 | Miyahara | H03M 1/1061 341/120 |
| 2010/0289680 | A1* | 11/2010 | Ho | H03M 1/1057 341/120 |
| 2011/0018605 | A1* | 1/2011 | Cho | H03M 1/1023 327/307 |
| 2012/0139766 | A1* | 6/2012 | Cyrusian | H03M 1/0845 341/120 |
| 2012/0293349 | A1* | 11/2012 | Chen | H03M 1/1014 341/120 |
| 2013/0222162 | A1* | 8/2013 | Xiao | H03M 1/1047 341/120 |
| 2014/0049415 | A1* | 2/2014 | Baumgartner | H03M 1/109 341/120 |
| 2014/0240152 | A1* | 8/2014 | Song | H03M 1/1061 341/120 |

* cited by examiner

RESISTOR-BASED CONFIGURATION SYSTEM

BACKGROUND

Configuration resistors are used by configuration circuits to determine digital codes. These digital codes are often used to configure parameters of integrated circuits (ICs) such as I2C bus addresses, boot options, device vendor information (e.g. part family or capacity), and other parameters. The number of unique digital codes that can be represented by a single resistor under test is limited by the resolution and accuracy with which a configuration circuit of the IC can determine resistance. Often the resistance is determined by measuring a value that is proportional to resistance, such as by measuring a voltage at a terminal of the resistor.

Some attempted solutions use a fixed current source to develop a fixed test voltage at a terminal of a configuration resistor and compare that fixed test voltage to a varying reference voltage. The result of the comparison is used to obtain a digital code.

Some attempted solutions use a varying current mirror circuit to develop both a varying test voltage at a terminal of a configuration resistor and a varying reference voltage. The varying test voltage is compared to the varying reference voltage. The result of the comparison is used to obtain a digital code. Because a current mirror circuit is used to develop the test voltage and the reference voltage, the test voltage and the reference voltage vary dependently.

Some attempted solutions use an analog-to-digital converter (ADC) coupled to a terminal of a configuration resistor. The ADC creates a digital representation of an analog signal at a terminal of a configuration resistor. The digital representation is used to obtain a digital code.

SUMMARY

In some embodiments, a configuration circuit for obtaining a digital code is disclosed. The configuration circuit for obtaining a digital code includes a controller circuit that generates a plurality of multibit control words. A digitally controlled current source circuit is coupled to the controller circuit to receive a multibit control word generated by the controller circuit. The digitally controlled current source circuit generates an output current that corresponds to the multibit control word, where the output current corresponds to the multibit control word in accordance with a predetermined output curve. A test voltage node is coupled to the digitally controlled current source circuit to receive the output current, whereby a test voltage develops in response to the output current. A reference voltage node develops a reference voltage, the level of the reference voltage being independent of the multibit control word. A voltage comparison circuit is coupled to the test voltage node, the reference voltage node and the controller circuit. The voltage comparison circuit (i) receives the test voltage and the reference voltage, (ii) compares the test voltage to the reference voltage to produce a comparison result and (iii) sends the comparison result to the controller circuit. The digital code is obtained by the configuration circuit using the comparison result and the multibit control word.

In some embodiments, a method for obtaining a digital code is disclosed. In some embodiments, one or more systems carry out one or more steps of a method that involves receiving a multibit control word at a digitally controlled current source circuit. An output current is generated that corresponds to the multibit control word using the digitally controlled current source circuit, where the output current corresponds to the multibit control word in accordance with a predetermined output curve. The output current is received at a test voltage node, whereby a test voltage develops in response to the output current. A reference voltage is developed at a reference voltage node, the level of the reference voltage being independent of the multibit control word. The test voltage is compared to the reference voltage using a voltage comparison circuit to produce a comparison result, and the digital code is obtained using the comparison result and the multibit control word.

One device serves to couple two other objects if it provides an electronic connection between them. Coupling means electrically connecting in the manner of a Kirchhoff current path.

DETAILED DESCRIPTION

Figure 1:
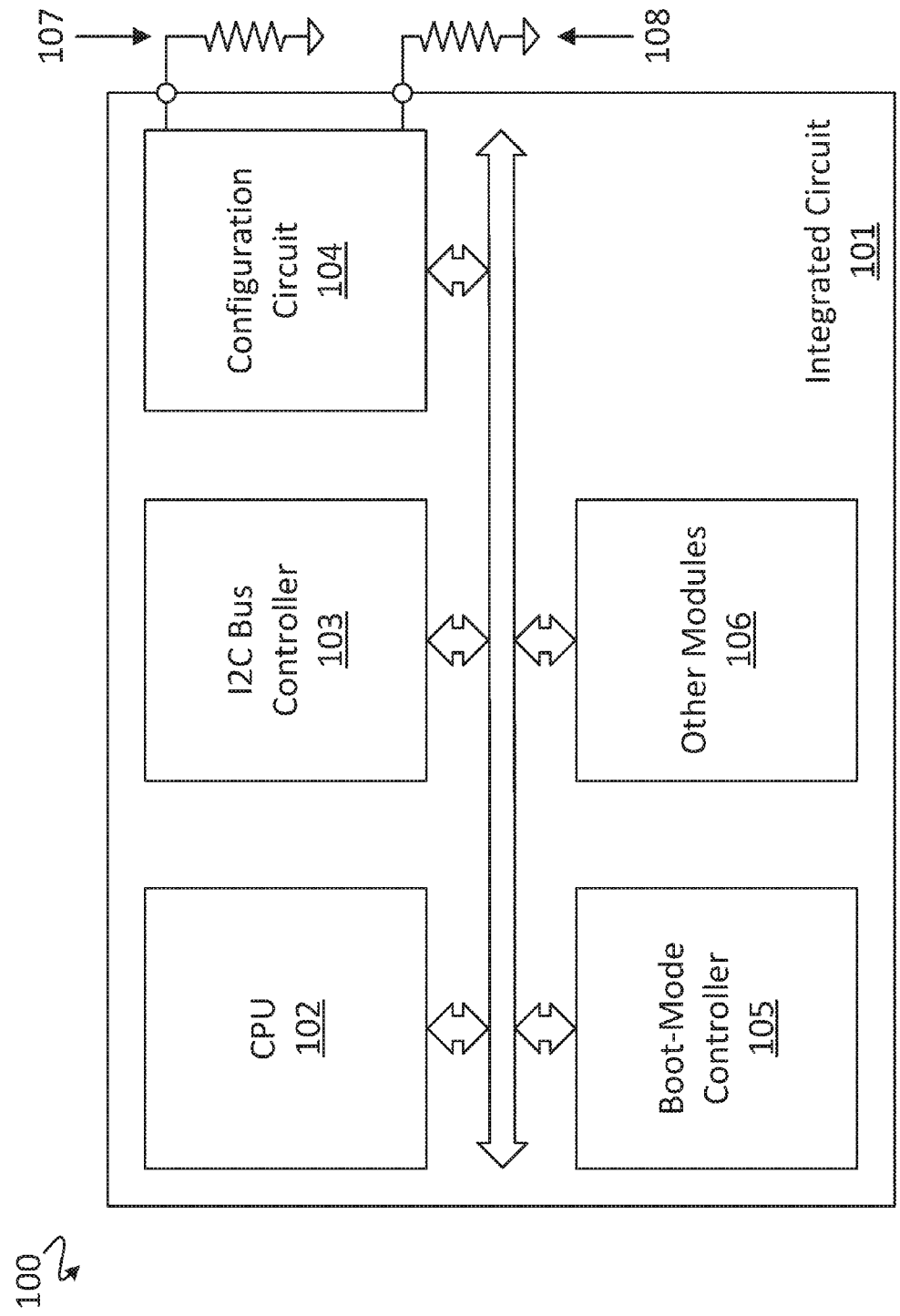
FIG. 1 is a simplified schematic diagram of a related art integrated circuit (IC) that includes a configuration circuit.

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

Embodiments of a configuration circuit of a resistor-based configuration system are disclosed. The configuration circuit determines a value that is proportional to the resistance of a resistor under test ("configuration resistor") and assigns (obtains) a digital code based on the determined value. In some embodiments, to maximize the number of values that can be determined (and subsequently assigned a digital code), increments in resistance of configuration resistors correspond to a log increment based on a multiple of the E96 resistor set or similar. In some embodiments, the configuration resistor is external to the configuration circuit but is not external to an IC that includes the configuration circuit. In other embodiments, the configuration resistor is external to both the configuration circuit and to an IC that includes the configuration circuit. In some embodiments, the configuration resistor is a potentiometer (e.g. an analog or digital potentiometer).

The highest resistance value that can be read by the configuration circuit can be chosen such that the RC parasitic time constant, due to the resistance, is below a desired threshold. In some approaches, the highest resistance value can be chosen in consideration of additional capacitances that are external to the configuration circuit. Such additional capacitances can be capacitances associated with a potentiometer and/or capacitances associated with oscilloscope probes. Board-level leakage can also limit the maximum available resistance of the configuration resistor that can be used. In some approaches, the lowest resistance value that can be determined by the configuration circuit is limited by the maximum amount of current that can be sourced by the configuration circuit. The lower the voltage across the configuration resistor that can be determined, the lower the resistance value that can be used, hence speeding up the test.

Some attempted solutions use an ADC to determine a voltage developed across a configuration resistor using a fixed output current. Instead of using a fixed current source, implementations of the configuration circuit described herein use a digitally controlled current source circuit to ramp an output current in accordance with a logarithmic function until a voltage developed at a terminal of a resistor under test crosses a pre-determined voltage threshold. In some embodiments, the voltage comparison is performed by a simple comparator, thereby eliminating ADC circuitry and reducing circuit complexity.

The digitally controlled current source ramps an output current through a series of output current level steps based on a received sequence of multibit control words sent from a controller circuit (e.g. a sequencer), where each step in output current level uniquely corresponds to a multibit control word. As the output current progressively increases, based on the received multibit control words, one of the output currents of the digitally controlled current source circuit will cause a voltage to develop across the resistor that exceeds the pre-determined voltage threshold. The multibit control word that uniquely corresponds to that output current level is used as the digital code.

With reasonable current and time limits, 64 unique digital codes are achievable. Further, as there are no closed loops around the resistor under test, there are no stability issues.

In some embodiments, the output current is controlled by a voltage-to-current converter circuit, where the input voltage of the voltage-to-current converter circuit can be set by a resistor string (e.g. of a digital-to-analog converter). The input voltage can increment using a defined or parameterized step size, allowing a log law to be developed in the output current. In some embodiments, the resistor-based configuration system steps through 8 current ranges and 8 current levels per range to give 64 unique levels of current. In some embodiments, the total output current range is from 2 μA to 486 μA.

Parasitic capacitance at high resistances may require longer settling times for each step in output current level. The time required for determination is limited by the speed of the digitally controlled current source circuit and the speed of the voltage comparison circuit. Because the output current level of each current level step is known, in some embodiments the step speed is adjusted based on the output current level. In other embodiments, a read time of 400 μS is used for each output current level.

In some embodiments, when the value of the resistor under test is determined, the corresponding obtained digital code is stored in memory and the resistor-based configuration system is shut down or put into a low-power state. As this process is normally performed at start-up (e.g. when enabling or powering on an IC), the configuration system is very noise immune. However, for added integrity, in some embodiments, several measurements are carried out and the result averaged or compared until subsequent codes are read as the same value.

In some embodiments, time is saved by using a successive approximation register (SAR) system. In some embodiments, the SAR system uses least significant bit (LSB) settling time at each step.

In some embodiments, more than one configuration resistor is used. The obtained digital code corresponding to each configuration resistor value is sequentially obtained and stored in memory. In some embodiments, where more speed is required, multiple digitally controlled current source circuits and voltage comparison circuits are used with a single controller circuit.

In some embodiments, an external 1% resistor is used to scale the system, hence requiring no further calibration. In some embodiments, one or more internal resistors are used to scale the system. Because silicon tolerance of a resistor is often +/−10% or worse, to reduce the temperature coefficient of resistance (TCR) a combination of two resistors are used. Though it is possible to trim the resistor value, in some embodiments, the reference voltage level is adjusted to mitigate scaling error.

FIG. 1 shows a simplified schematic diagram 100 of a related art integrated circuit (IC) 101 that includes a configuration circuit 104. Some elements are omitted for ease of illustration and explanation.

As shown, the configuration circuit 104 is coupled to a central processing unit (CPU) 102, an I2C bus controller 103, a boot-mode controller 105 and other modules 106. The configuration circuit 104 determines a first value (e.g. a voltage) that is proportional to the resistance of a first resistor under test. In this example, the first resistor under test is a configuration resistor 107. The configuration circuit 104 also determines a second value that is proportional to the resistance of a second resistor under test. In this example, the second resistor under test is a configuration resistor 108. The first value is used to obtain a first digital code, and the second value is used to obtain a second digital code.

In a first scenario, the first digital code is received by the I2C bus controller 103 and is used to assign an I2C slave mode bus address to the IC 101. For example, the configuration circuit 104 can detect seven unique resistances within a resistance range of 2.2 k Ohms to 18 k Ohms. In this example, a detected resistance value of 2.2 k Ohms corresponds to a digital code of 001b, a resistance value of 4.4 k Ohms corresponds to a digital code of 010b, a resistance value of 7 k Ohms corresponds to a digital code of 011b, and so on. Thus, if the configuration resistor 107 has a resistance that is close to 4.4 k Ohms, the first digital code is 010b. The first digital code is then used by the I2C bus controller 103 as the three lowest bits of an I2C slave-mode bus address.

In a second example scenario, the second digital code is received by the boot-mode controller 105 and is used to assign a boot-mode to the IC 101. Using the same mapping of resistance to digital codes introduced in the first example, if the configuration resistor 108 has a resistance that is close to 2.2 k Ohms, the second digital code is 001b. The second digital code is then used by the boot-mode controller 105 to configure the IC 101 to boot from an external non-volatile memory device (e.g. rather than booting from an internal ROM module).

FIGS. 2-13 disclose improvements and modifications to the system described with reference to FIG. 1. These improvements and modifications are also applicable to a broader class of applications in the electronic and computerized arts including any application that utilizes a configuration impedance to set a digital code for an electronic system.

Figure 2:
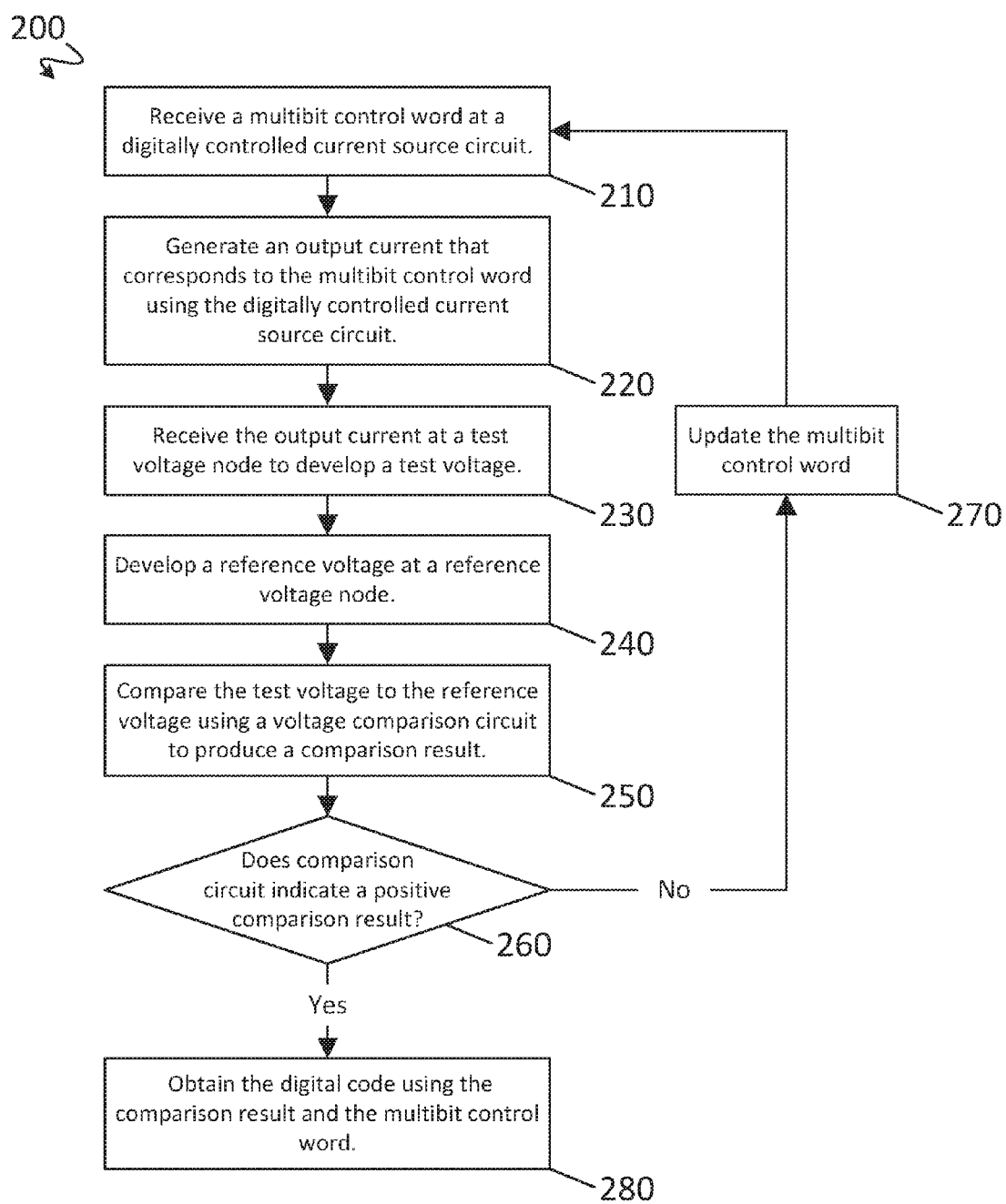
FIG. 2 provides an example process for obtaining a digital code.

FIG. 2 provides an example process for obtaining a digital code. At step 210, a multibit control word is received at a digitally controlled current source circuit. Next, an output current that corresponds to the multibit control word is generated using the digitally controlled current source circuit at step 220. The output current corresponds to the multibit control word in accordance with a predetermined output curve. Examples of a predetermined output curve are discussed in detail with reference to FIG. 13.

At step 230, the output current is received at a test voltage node. A test voltage is developed at the test voltage node in response to the output current. In some embodiments, a resistor under test, such as a configuration resistor, couples the test voltage node to a DC bias voltage (e.g. ground) and the test voltage develops because of the flow of the output current through the configuration resistor in accordance with Ohm's Law. In some embodiments, the configuration resistor has a resistance that is a multiple of a resistance of the E96 resistor set or similar resistor set.

At step 240, a reference voltage is developed at a reference voltage node. The level of the reference voltage developed at the reference voltage node is independent of the multibit control word. Next, the test voltage is compared to the reference voltage using a voltage comparison circuit to produce a comparison result at step 250.

At step 260, it is determined if the comparison result produced by the comparison circuit at step 250 is positive. In some embodiments, the comparison result is positive if the test voltage surpasses a threshold voltage range from the reference voltage. If it is determined at step 260 that the comparison circuit does not indicate a positive comparison result, process flow proceeds to step 270. At step 270, the multibit control word is updated and process flow returns to step 210 (thereafter, at step 220, an updated output current corresponding to the updated multibit control word is generated). In some embodiments, the multibit control word is updated by incrementing the value of the multibit control word. In some embodiments, the multibit control word is updated by decrementing the value of the multibit control word. In some embodiments, the multibit control word is updated by providing a different multibit control word.

If it is determined at step 260 that the comparison result produced by the comparison circuit is positive, process flow proceeds to step 280. At step 280 the digital code is obtained using the comparison result and the multibit control word.

Figure 3:
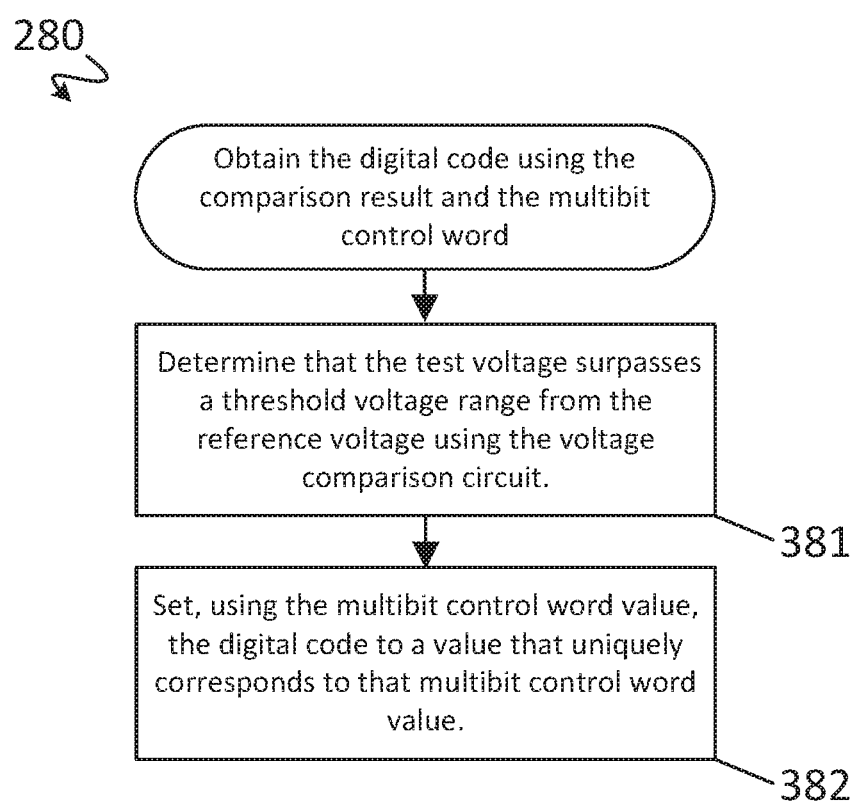
FIG. 3 provides an example process for obtaining a digital code using a comparison result and a multibit control word.

FIG. 3 provides an example process for obtaining a digital code using the comparison result and the multibit control word introduced in FIG. 2. In some embodiments, the steps shown in FIG. 3 are included as part of step 280 of FIG. 2.

At step 381, it is determined, (e.g. by using a comparison result received from the voltage comparison circuit), that the test voltage surpasses a threshold voltage range from the reference voltage. In some embodiments, the test voltage surpasses the threshold voltage range from the reference voltage when the test voltage is equal to or greater than the reference voltage, and does not surpass the threshold voltage range when the test voltage is less than the reference voltage. In other embodiments, the test voltage surpasses the threshold voltage range from the reference voltage when the test voltage is equal to or less than the reference voltage and does not surpass the threshold voltage range when the test voltage is greater than the reference voltage. Then, at step 382, the multibit control word is used to set the digital code to a value that uniquely corresponds to the multibit control word value.

An example embodiment of a circuit used to carry out some, or all, of the processes shown in FIG. 2 and in FIG. 3 is discussed next.

Figure 4:
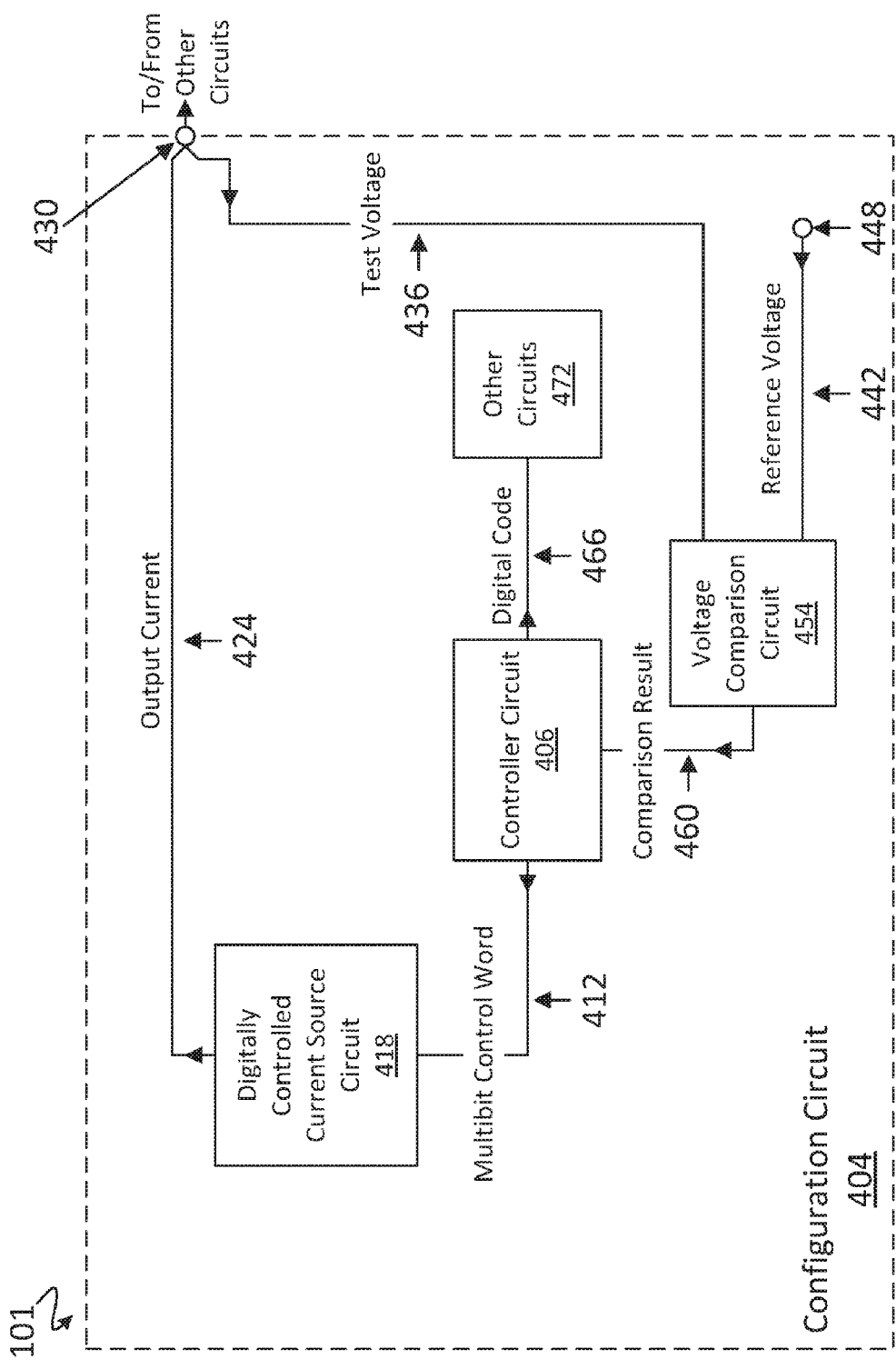
FIG. 4 is a simplified schematic diagram of a configuration circuit for obtaining a digital code.

FIG. 4 is a simplified schematic diagram of a configuration circuit 404 for obtaining a digital code. Some elements are omitted for ease of illustration and explanation. In some embodiments, the configuration circuit 404 is part of the IC 101. In other embodiments, the configuration circuit 404 is a circuit external to the IC 101.

As shown, the configuration circuit 404 includes a controller circuit 406 that is coupled to a digitally controlled current source circuit 418, a voltage comparison circuit 454 and to other circuits 472. A test voltage node 430 is coupled to the digitally controlled current source circuit 418 and to the voltage comparison circuit 454. A reference voltage node 448 is coupled to the voltage comparison circuit 454.

The controller circuit 406 generates a plurality of multibit (e.g. 6 bit) control words (e.g. a series of numerically ascending or descending values). A multibit control word 412 generated by the controller circuit 406 is received at the digitally controlled current source circuit 418, which generates an output current 424 that corresponds to the multibit control word 412 in accordance with a predetermined output curve. Examples of the predetermined output curve are discussed in detail with reference to FIG. 13.

The test voltage node 430 receives the output current 424, and a test voltage 436 develops at the test voltage node 430 in response to the output current 424. The reference voltage node 448 develops a reference voltage 442, the level of which is independent of the multibit control word 412. The voltage comparison circuit 454 receives the test voltage 436 and the reference voltage 442 and compares them to produce a comparison result 460. The comparison result 460 is received by the controller circuit 406.

If the comparison result 460 indicates that the test voltage 436 surpasses a threshold voltage range from the reference voltage 442 (e.g. a positive result), a digital code 466 is obtained by the configuration circuit 404. The digital code 466 is obtained using the comparison result 460 and the multibit control word 412 by setting the digital code 466 to a value that uniquely corresponds to the value of the multibit control word 412.

The controller circuit 406 can include a sequencer or basic digital counter. The digital counter of the controller circuit 406 can be incremented at step 270 of FIG. 2 (e.g. for each iteration of the loop back from step 260 to step 210). The digitally controlled current source circuit 418 can include a DAC circuit that develops a voltage based on the multibit control word 412, and a voltage-to-current converter circuit that produces the output current 424 based on the developed voltage. Furthermore, the voltage-to-current converter circuit can utilize an impedance that exhibits similar process and/or temperature variation to an impedance utilized to develop the reference voltage 442. The benefits of this class of approaches are described below in more detail with reference to a specific implementation in FIGS. 9A and 9B.

In some embodiments, the controller circuit 406 uses the comparison result 460 and the multibit control word 412 to obtain the digital code 466. In some embodiments, the other circuits 472 include memory, including volatile memory, for storing the obtained digital code 466. In some embodiments, the other circuits 472 include a circuit that uses the obtained digital code 466 directly (e.g. the I2C bus controller 103). In some embodiments, the other circuits 472 includes a look-up-table for transforming the digital code 466 into another value (e.g. transforming the digital value into a character-based representation of a vendor ID).

Generating an Output Current Corresponding to a Multibit Control Word

As was described earlier, a multibit control word is used by a digitally controlled current source circuit to generate a corresponding output current. The output current is received at a test voltage node, and in response to the output current, a test voltage is developed at the test voltage node (e.g. due to current flow through a configuration resistor).

Figure 5:
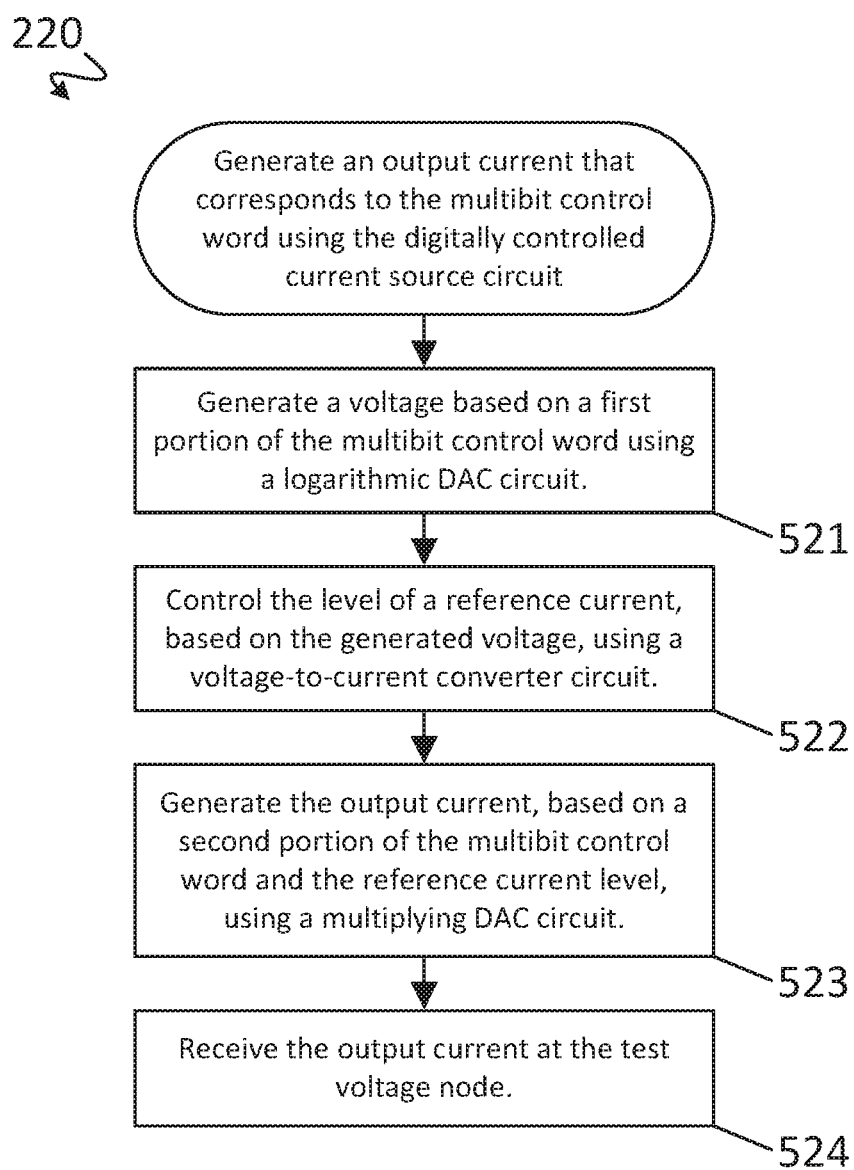
FIG. 5 provides an example process for generating an output current that corresponds to a multibit control word using a digitally controlled current source circuit.

FIG. 5 provides an example process for generating the output current that corresponds to the multibit control word using the digitally controlled current source circuit. In some embodiments, the steps shown in FIG. 5 are included as part of step 220 of FIG. 2. As shown, at step 521, a voltage based on a first portion of the multibit control word is generated using a logarithmic digital-to-analog conversion (DAC) circuit. At step 522, the generated voltage is used by a voltage-to-current converter circuit to control the level of a reference current. Then, at step 523, the output current is generated by a multiplying DAC circuit based on a second portion of the multibit control word and the reference current level. At step 524, the output current is received at the test voltage node.

In some embodiments, the first portion of the multibit control includes the lower half (e.g. the least significant bits) of the multibit control word, and the second portion of the multibit control word includes the upper half of the multibit control word (e.g. the most significant bits).

Figure 6:
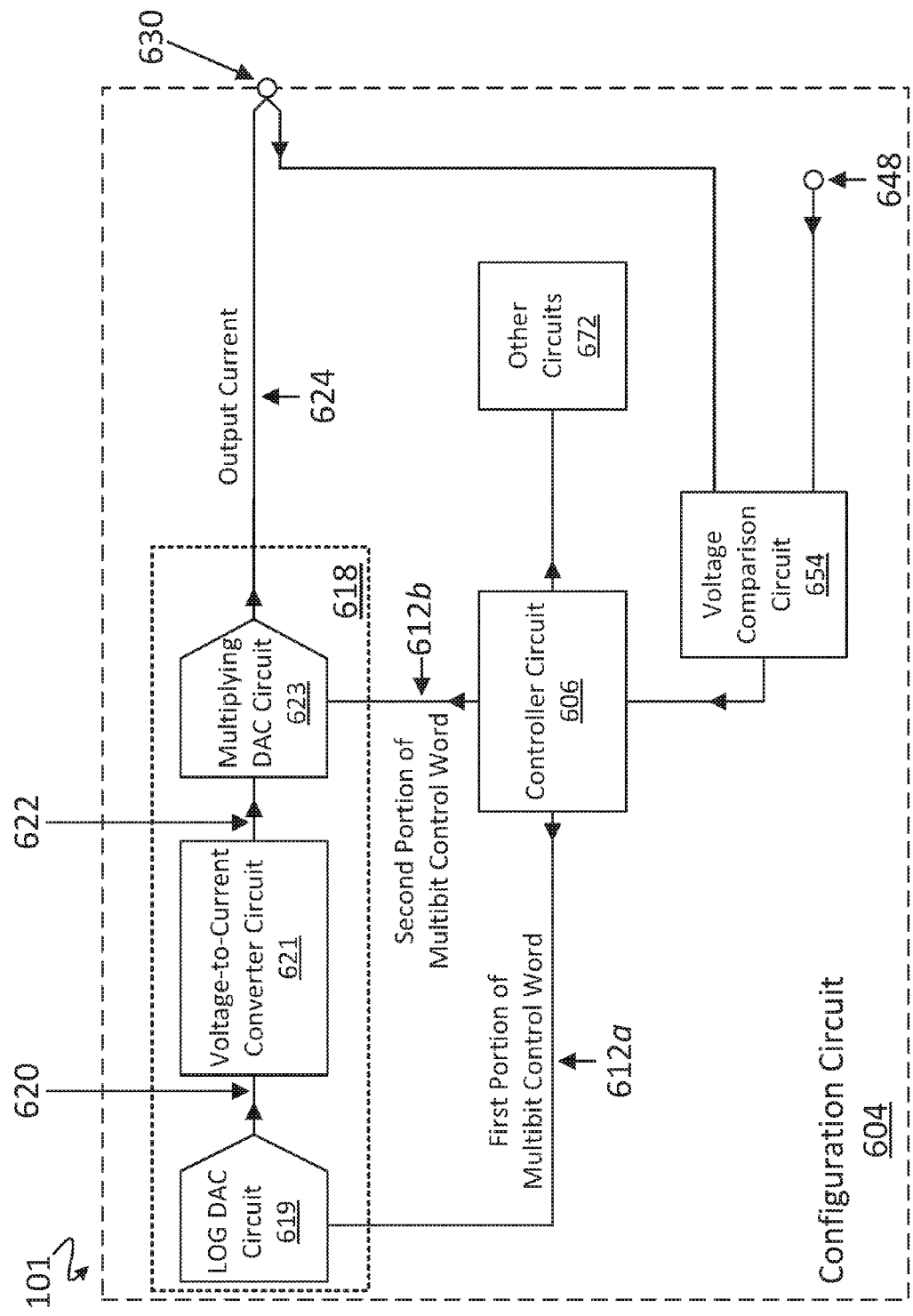
FIG. 6 is a simplified schematic diagram of a configuration circuit that has a digitally controlled current source circuit.

An example embodiment of a circuit used to carry out some, or all, of the process shown in FIG. 5 is discussed next with reference to FIG. 6, which is a simplified schematic diagram of a configuration circuit 604 that has a digitally controlled current source circuit 618. Some elements are omitted for ease of illustration and explanation. In some embodiments, the configuration circuit 604 is part of the IC 101. In other embodiments, the configuration circuit 604 is a circuit external to the IC 101.

As shown, the digitally controlled current source circuit 618 includes a logarithmic (LOG) DAC circuit 619 coupled to a controller circuit 606; a voltage-to-current converter circuit 621 coupled to the LOG DAC circuit 619; and a multiplying DAC circuit 623 that is coupled to the voltage-to-current converter circuit 621, to the controller circuit 606 and to a test voltage node 630. Also shown is a voltage comparison circuit 654, other circuits 672 and a reference voltage node 648. These circuits perform functions similar to those performed by similar circuits as described with reference to previous figures.

A logarithmic DAC circuit generates an analog signal (e.g. a voltage or current) based on a received digital code word, where the logarithm of the generated analog signal is proportional to the received digital code word. Accordingly, the LOG DAC circuit 619 receives a first portion of a multibit control word 612a from the controller circuit 606. In some embodiments, the first portion of the multibit control 612a word includes half of the total bits of a multibit control word. In some embodiments, the multibit control word is 6 bits long and the first portion of the multibit control word 612a includes the lower 3 bits of the multibit control word. The LOG DAC circuit 619 uses the first portion of the multibit control word 612a to generate a voltage 620.

The generated voltage 620 is received at the voltage-to-current converter circuit 621, which controls the level of a reference current 622 based on the generated voltage 620. The multiplying DAC circuit 623 receives a second portion of the multibit control word 612b from the controller circuit 606. In some embodiments, the multibit control word is 6 bits long and the second portion of the multibit control word 612b includes the upper 3 bits of the multibit control word. The multiplying DAC circuit 623 uses the second portion of the multibit control word 612b and the level of the reference current 622 to generate an output current 624 that is received at the test voltage node 630.

A multiplying DAC circuit multiplies an analog reference signal by a digital code word to produce an analog output (e.g. a voltage or a current). Accordingly, the multiplying DAC circuit 623 multiplies a value proportional to the level of the reference current 622 by a value proportional to the second portion of the multibit control word 612b to generate the output current 624. Thus, a wide range of output current levels can be generated by the digitally controlled current source circuit 618, and as such a wide range of resistances of resistors under test can be determined.

Controlling the Level of a Reference Current Across Circuit Temperature Variations As was previously discussed, a digitally controlled current source circuit provides an output current to develop a test voltage at a test voltage node. By design, the test voltage varies independently from a reference voltage developed at a reference voltage node. However, resistors are known to have a temperature coefficient of resistance (TCR), represented as ppm per degree Kelvin, whereby actual resistance deviates from an ideal resistance as a function of temperature. Because the test voltage and the reference voltage depend on internal resistances of the configuration circuit, effects due to circuit heating could negatively impact the accuracy of the voltage comparison performed by a voltage comparison circuit. That is, due to heating of the configuration circuit, a single multibit control word could result in multiple output current levels depending on the temperature of the configuration circuit. If, however, the test voltage and the reference voltage are made to experience the same or similar deviations based on temperature and/or process, a voltage comparison of the test voltage and the reference voltage performed by the voltage comparison circuit will be accurate.

In some embodiments, the test voltage and the reference voltage are developed using resistance circuits that have the same or similar TCRs. An example of this approach is described in FIG. 7, which provides an example process for controlling the level of a reference current using a voltage-to-current converter circuit. In some embodiments, the steps shown in FIG. 7 are included as part of step 522 of FIG. 5.

At step 723, the generated voltage (from the LOG DAC) is received at an input of an operational amplifier (op-amp) of the voltage-to-current converter circuit. Then, an output of the op-amp is used to drive a field-effect-transistor (FET) of the voltage-to-current converter circuit at step 724. At step 725, a first current is caused to flow from the FET (e.g. by driving a gate node of the FET) to a reference current resistance circuit of the voltage-to-current converter circuit. The level of the first current is based on the generated voltage and the reference current resistance circuit. At step 726, a feedback signal from the FET is received at another input of the op-amp. Then, at step 727, a second current that is equal to the first current is caused to flow from the multiplying DAC circuit to the FET, where the second current is the reference current.

In some embodiments, the reference current resistance circuit has a temperature coefficient of resistance (TCR) that is lower than 50 ppm per degree Kelvin.

Figure 7:
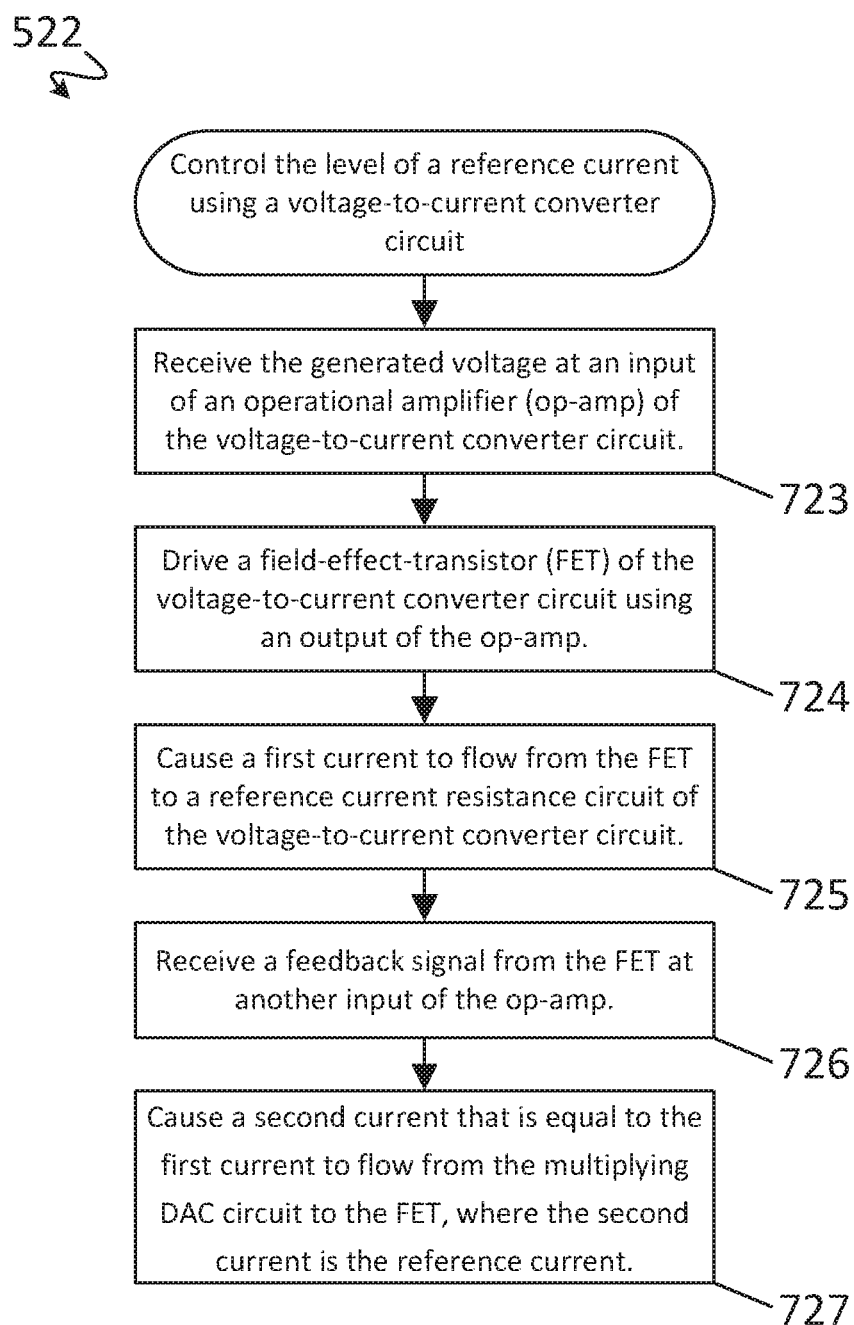
FIG. 7 provides an example process for controlling the level of a reference current using a voltage-to-current converter circuit.
Figure 8:
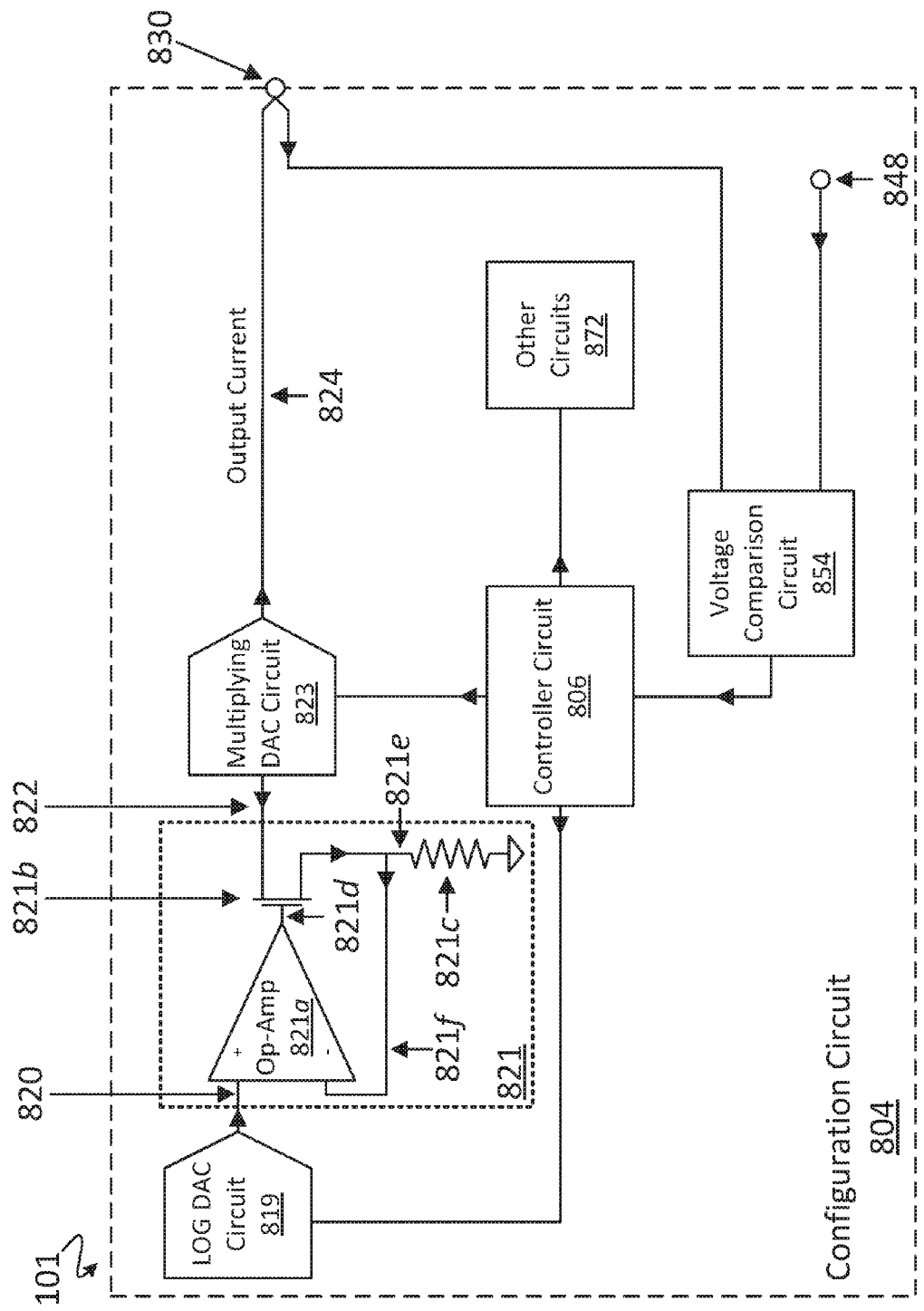
FIG. 8 is a simplified schematic diagram of a configuration circuit with a voltage-to-current converter circuit.

An example embodiment of a circuit used to carry out some, or all, of the process shown in FIG. 7 is discussed next with reference to FIG. 8, which is a simplified schematic diagram of a configuration circuit 804 with a voltage-to-current converter circuit 821. Some elements are omitted for ease of illustration and explanation. In some embodiments, the configuration circuit 804 is part of the IC 101. In other embodiments, the configuration circuit 804 is a circuit external to the IC 101.

As shown, the voltage-to-current converter circuit 821 includes an operational-amplifier (op-amp) 821a coupled to a LOG DAC circuit 819; a field-effect-transistor (FET) 821b coupled to the op-amp 821a and to a multiplying DAC circuit 823; and a reference current resistance circuit 821c coupled to the FET 821b, the op-amp 821a and to a DC bias voltage (e.g. ground).

The op-amp 821a receives a generated voltage 820 from the LOG DAC circuit 819. The FET 821b then receives an output voltage 821d from the op-amp 821a, and in response, provides a current 821e to the current resistance circuit 821c. The FET 821b additionally receives a reference current 822 from the multiplying DAC circuit 823 and provides a feedback voltage 821f to the op-amp 821a. The level of the current 821e through the resistance circuit 821c is based on the generated voltage 820 and the reference current resistance circuit 821c (e.g. the resistance thereof). The level of the reference current 822 is the same as the level of the current 821e through the resistance circuit 821c.

In some embodiments, the reference current resistance circuit 821c is a single resistor. In some embodiments, the reference current resistance circuit 821c includes multiple resistors. In some embodiments, the reference current resistance circuit 821c has a temperature coefficient of resistance (TCR) that is lower than 50 ppm per degree Kelvin.

Next, processes and circuits for developing the reference voltage at the reference voltage node are described.

Developing the Reference Voltage

Figure 9A:
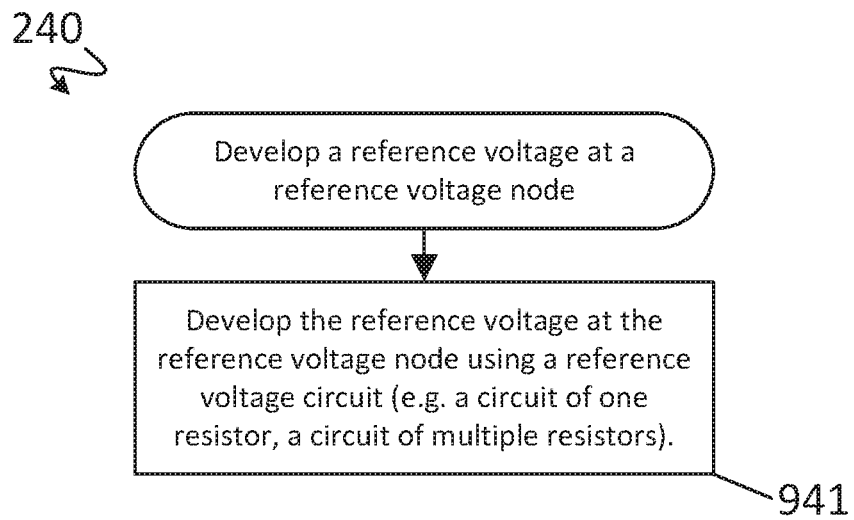
FIG. 9A provide an example process for developing a reference voltage at a reference voltage node.
Figure 9B:
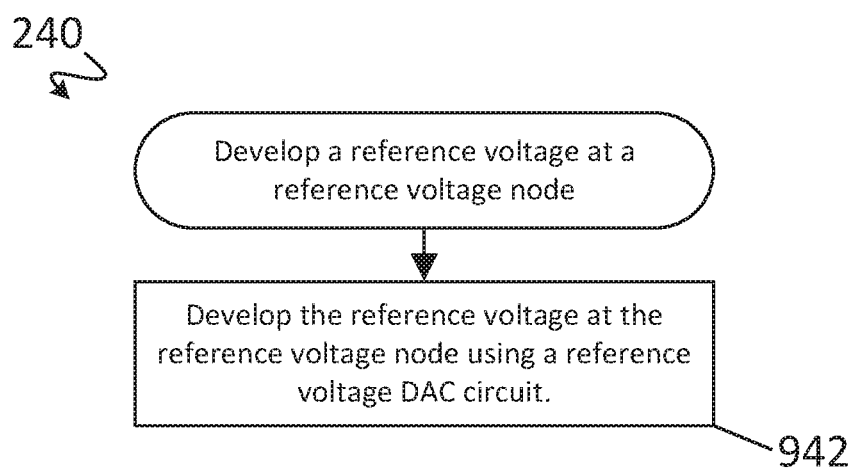
FIG. 9B provide an example process for developing a reference voltage at a reference voltage node.

In some embodiments, the test voltage and the reference voltage are made to exhibit similar temperature and/or process based deviations by using resistance circuits that have the same or similar TCRs. FIG. 9A and FIG. 9B provide example processes for developing a reference voltage at a reference voltage node using resistance circuits which individually have a TCR that equals the TCR of the reference current resistance circuit as was described with reference to FIG. 7 and FIG. 8. In some embodiments, either the steps shown in FIG. 9A or the steps shown in FIG. 9B are included as part of step 240 of FIG. 2.

In one embodiment, at step 941 of FIG. 9A, the reference voltage is developed at the reference voltage node using a reference voltage circuit. The reference voltage circuit includes a resistance circuit having a TCR equal to the TCR of the reference current resistance circuit as was described with reference to FIG. 7 and FIG. 8.

In another embodiment, at step 942 of FIG. 9B, the reference voltage is developed at the reference voltage node using a reference voltage DAC circuit. The reference voltage DAC circuit includes a resistance circuit that has a TCR that is equal to the TCR of the reference current resistance circuit as was described with reference to FIG. 7 and FIG. 8. Thus, with reference to either FIG. 9A or to FIG. 9B, as circuit temperatures fluctuates, the test voltage and the reference voltage will deviate from their ideal values similarly.

Figure 10:
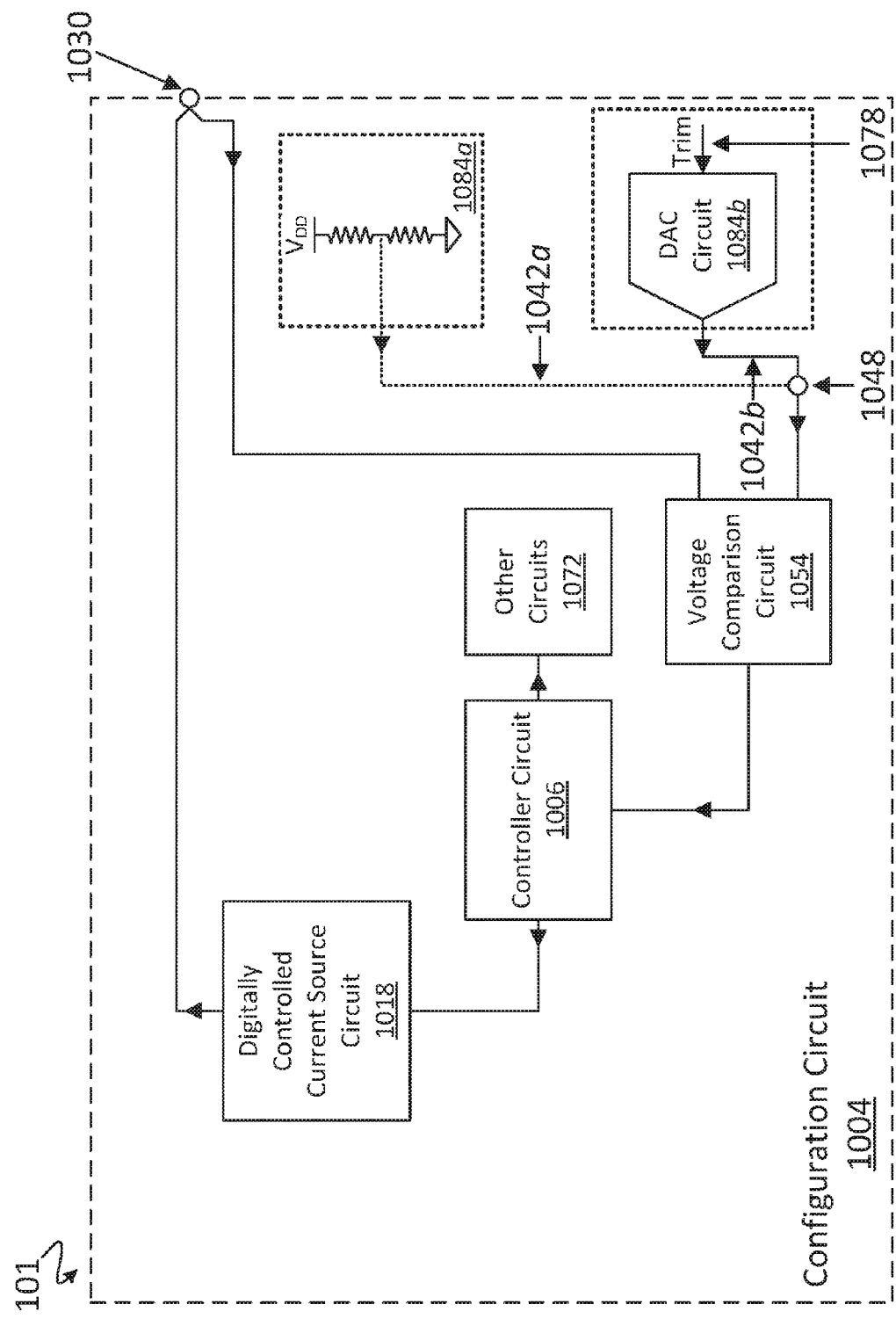
FIG. 10 is a simplified schematic diagram of a configuration circuit with two embodiments of a reference voltage source circuit.

FIG. 10 is a simplified schematic diagram of a configuration circuit 1004 with two embodiments, 1084a and 1084b, of a reference voltage source circuit used to carry out the steps shown in FIG. 9A and FIG. 9B, respectively. Some elements are omitted for ease of illustration and explanation. In some embodiments, the configuration circuit 1004 is part of the IC 101. In other embodiments, the configuration circuit 1004 is a circuit external to the IC 101.

One embodiment of the reference voltage source circuit includes a resistor divider network 1084a. In some embodiments, the resistor divider network 1084a is coupled to a reference voltage node 1048 and is used to develop a reference voltage 1042a that is received by a voltage comparison circuit 1054. Although the resistor divider network 1084a is shown as a pair of resistors coupled between two bias voltages, the resistor divider network could include transistors and could be coupled to a current source instead of a bias voltage.

Another embodiment of the reference voltage source circuit includes a DAC circuit 1084b. In some embodiments, the DAC circuit 1084b is coupled to the reference voltage node 1048. The DAC circuit 1048b receives a digital trim value 1078 (e.g. a digital code) and generates a reference voltage 1042b that is received at the voltage comparison circuit 1054, where the reference voltage 1042b is based on the digital trim value 1078.

In yet another embodiment, the reference voltage node 1048 is coupled to a circuit (not shown) that is external to the configuration circuit 1004. The external circuit (e.g. an external resistor) is used to develop a reference voltage at the reference voltage node 1048.

Also, shown in the configuration circuit 1004 is a controller circuit 1006, a digitally controlled current source circuit 1018, other circuits 1072 and a test voltage node 1030. These circuits perform functions similar to those performed by similar circuits as described with reference to previous figures.

Obtaining Multiple Digital Codes from Multiple Configuration Resistors

In some embodiments, additional configuration resistors are used to obtain additional digital codes. For example, a first configuration resistor is used to obtain an I2C slave bus address of an IC while a second configuration resistor is used to select a boot-mode of the IC.

Figure 11:
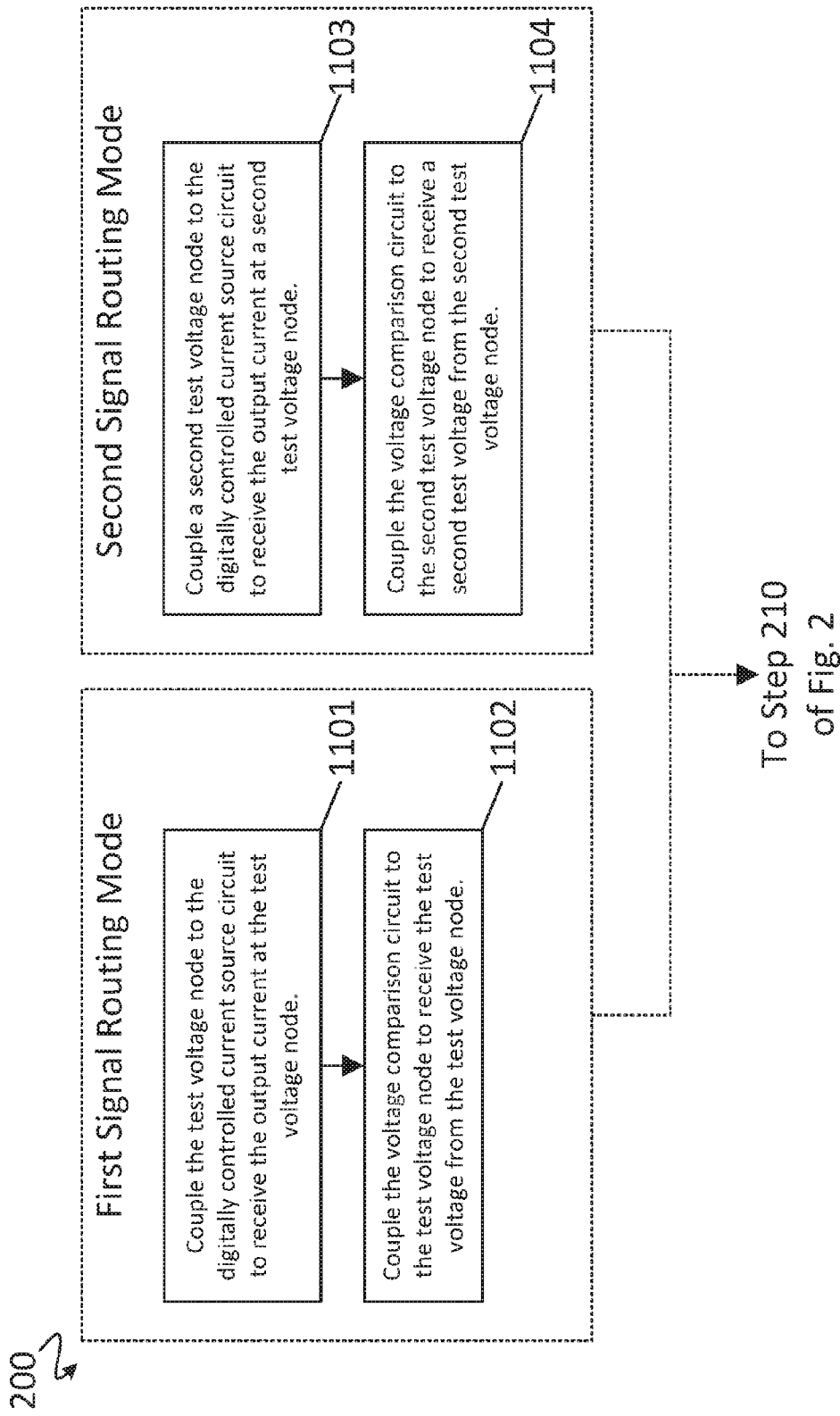
FIG. 11 provides an example process for obtaining multiple digital codes using multiple configuration resistors.

FIG. 11 provides an example process for obtaining multiple digital codes using multiple configuration resistors. In some embodiments, the steps shown in FIG. 11 occur before step 210 of FIG. 2.

As shown, a first signal routing mode includes, at step 1101, coupling the test voltage node to the digitally controlled current source circuit to receive the output current at the test voltage node. The first signal routing mode also includes, at step 1102, coupling the voltage comparison circuit to the test voltage node to receive the test voltage from the test voltage node.

A second signal routing mode includes coupling, at step 1103, a second test voltage node to the digitally controlled current source circuit to receive the output current at a second test voltage node. The second signal routing mode also includes, at step 1104, coupling the voltage comparison circuit to the second test voltage node to receive a second test voltage from the second test voltage node. In some embodiments, there are more than two signal routing modes.

Figure 12:
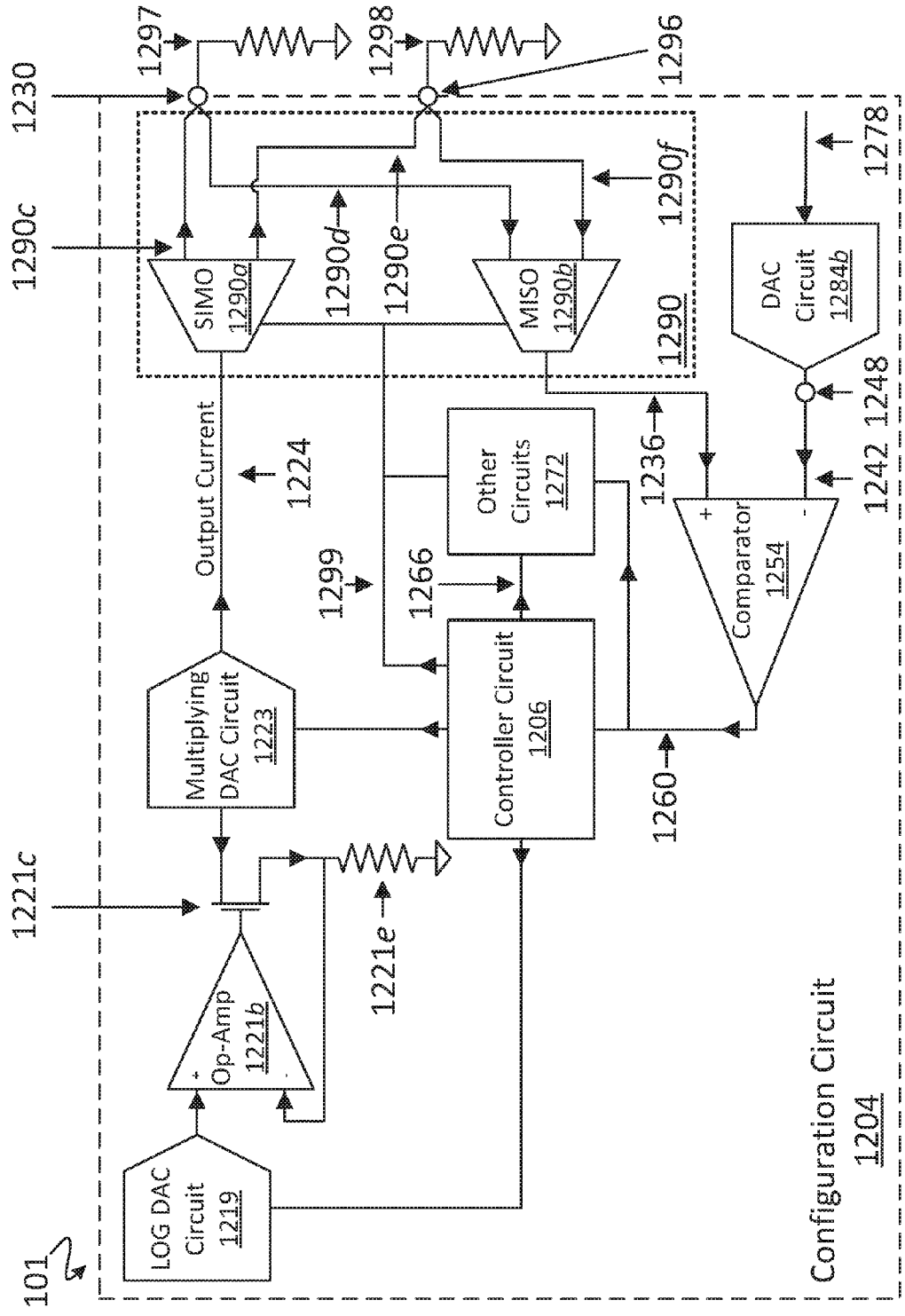
FIG. 12 is a simplified schematic diagram of a configuration circuit with a signal routing circuit.

An example embodiment of a circuit used to carry out some, or all, of the process shown in FIG. 11 is discussed next with reference to FIG. 12, which is a simplified schematic diagram of a configuration circuit 1204 with a signal routing circuit 1290. Some elements are omitted for ease of illustration and explanation. In some embodiments, the configuration circuit 1204 is part of the IC 101. In other embodiments, the configuration circuit 1204 is a circuit external to the IC 101.

As shown, the signal routing circuit 1290 includes a single-input multi-output (SIMO) selection circuit 1290a that is coupled to a multiplying DAC circuit 1223, a first test voltage node 1230, and to a second test voltage node 1296. The signal routing circuit 1290 also includes a multi-input single-output (MISO) selection circuit 1290b that is coupled to a comparator 1254 (e.g. a voltage comparison circuit), the first test voltage node 1230, and to the second test voltage node 1296. The first test voltage node 1230 is coupled to a configuration resistor 1297 and the second test voltage node 1296 is coupled to a configuration resistor 1298. Also shown is a controller circuit 1206, a LOG DAC circuit 1219, an op-amp circuit 1221b, a FET 1221c, a reference current resistance circuit 1221e and other circuits 1272. These circuits perform functions similar to those performed by similar circuits as described with reference to previous figures.

A selection signal 1299 is received by the signal routing circuit 1290 to select between a first signal routing mode of the signal routing circuit 1290 and a second signal routing mode of the signal routing circuit 1290. An output current 1224 is received at an input of the SIMO 1290a. In the first signal routing mode of the signal routing circuit 1290, the SIMO 1290a couples output current 1290c (equal to output current 1224) to the first test voltage node 1230 and the MISO 1290b couples the first test voltage node 1230 to the comparator 1254. In response to the output current 1290c flowing through the configuration resistor 1297, a first test voltage 1290d develops at the first test voltage node 1230.

In the second signal routing mode of the signal routing circuit 1290, the SIMO 1290a couples output current 1290e (equal to output current 1224) to the second test voltage node 1296 and the MISO 1290b couples the second test voltage node 1296 to the comparator 1254. In response to the output current 1290e flowing through the configuration resistor 1298, a second test voltage 1290f develops at the second test voltage node 1296.

A DAC circuit 1284b develops a reference voltage 1242 at a reference voltage node 1248 based on a digital value 1278. In the first signal routing mode of the signal routing circuit 1290, the comparator 1254 compares the reference voltage 1242 to test voltage 1236 which is equal to the first test voltage 1290d. In the second signal routing mode of the signal routing circuit 1290, the comparator 1254 compares the reference voltage 1242 to the test voltage 1236 which is equal to the second test voltage 1290f.

In some embodiments, the other circuits 1272 receives an obtained digital code 1266 and the selection signal 1299 from the controller circuit 1206 and receives a comparison result 1260 from the comparator 1254. The other circuits 1272 uses these received signals to determine where the digital code 1266 will be stored or routed.

In some embodiments, the other circuits 1272 includes a memory circuit which may include volatile memory. In some embodiments, a first digital code obtained using the configuration resistor 1297 and a second digital code obtained using the configuration resistor 1298 are stored in the memory circuit. In some embodiments, multiple digitally controlled current source circuits and multiple voltage comparison circuits are used to obtain additional digital codes using additional configuration resistors.

As was discussed earlier with reference to FIG. 2, if the comparison result does not indicate a positive result, the multibit control word is updated (e.g. incremented), the updated multibit control word is received at the digitally controlled current source circuit, and an updated output current that corresponds to the updated multibit control word is generated. The iterative updating of the multibit control word and resultant corresponding output current values can be represented as an output curve.

Figure 13:
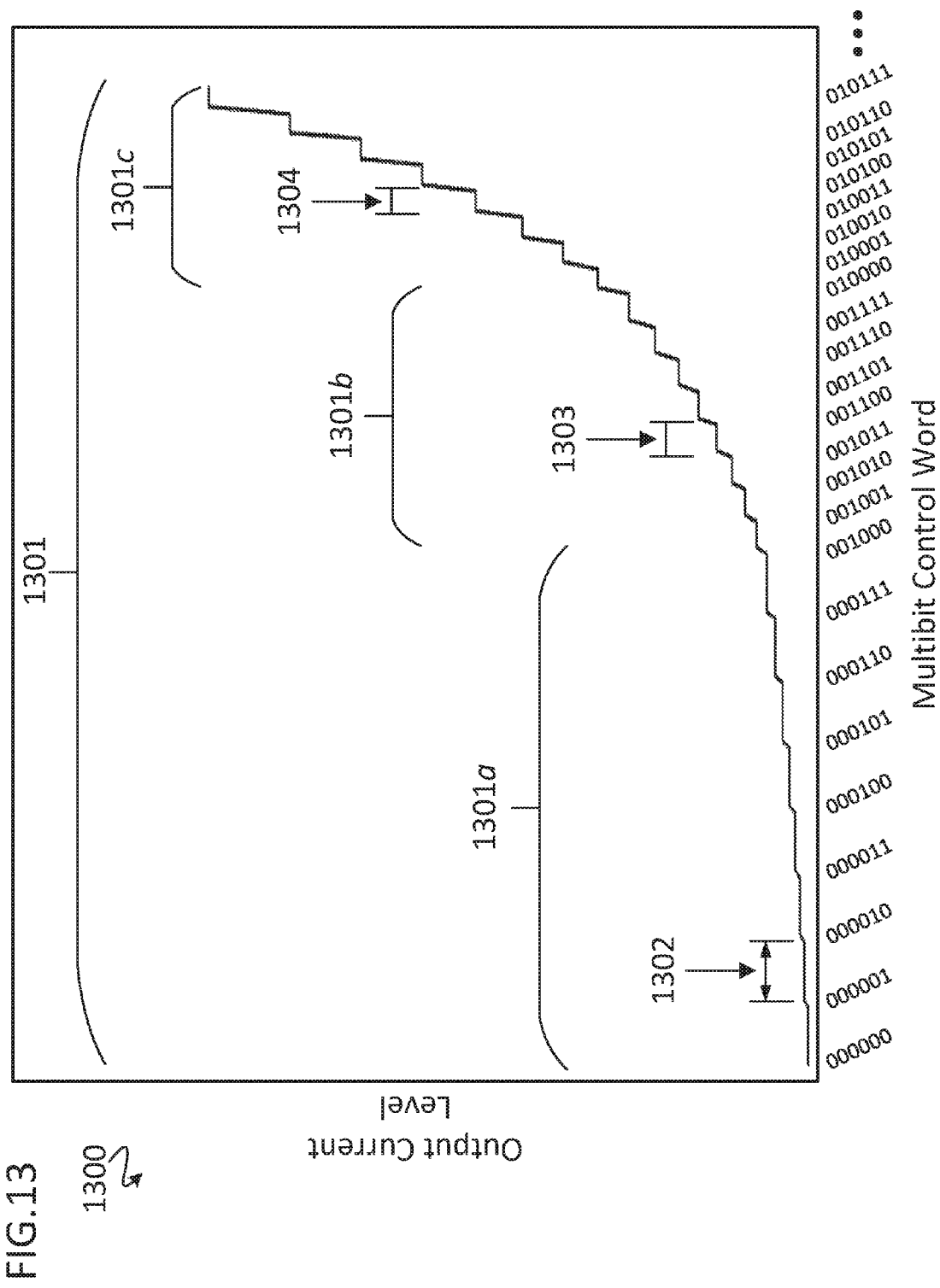
FIG. 13 shows a simplified graph of a predetermined output current level curve.

Attention is now turned to FIG. 13 which shows a simplified graph 1300 of a predetermined output curve ("output curve") 1301. The output curve 1301 includes curve segments 1301a-c. Each step of the output curve 1301 is an output current level that uniquely corresponds to a respective value of a multibit control word generated by a controller circuit. As shown, the predetermined output curve 1301 is of a non-linear function. In some embodiments, the non-linear function has a log relationship between each output current level and a respective multibit control word. In some embodiments, the non-linear function has a polynomial relationship between each output current level and a respective multibit control word. In the example shown, each of the multibit control words are 6 bits long. In some embodiments, the lower three bits of the multibit control word are received by a LOG DAC circuit and the upper three bits of the multibit control word are received by a multiplying DAC circuit, as was described with reference to FIG. 6. Thus, in some embodiments, the lower three bits of the multibit control word control the shape of each of the curve segments 1301a-c and the upper three bits of the multibit control word scale the curve segments 1301a-c.

As shown, each output current level step has a corresponding step duration. For example, a step of the curve segment 1301a has a corresponding step duration 1302; a step of the curve segment 1301b has a corresponding step duration 1303; and a step of the curve segment 1301c has a corresponding step duration 1304. In some embodiments, the corresponding step duration of each output current level step is less than 5 RC time constants (due to the configuration resistor and parasitic board capacitance) greater than the minimum amount of time that the digitally controlled current source circuit will produce a current at that output current level. In some embodiments, 5 RC time constants is about 20 microseconds.

As was described earlier, due to parasitic capacitance, resistors under test that have a high resistance may require longer settling times for each step in output current level. Therefore, a lower output current can require more settling time than a higher output current. Accordingly, the voltage comparison circuit may use a longer sampling time for resistors under test that have a high resistance than the sampling time used for resistors under test that have a low resistance. Thus, in some embodiments, the respective step duration and the output current level are inversely proportional. For example, the output current level that corresponds to the step duration 1302 is lower than the output current level that corresponds to the step duration 1304. Accordingly, the step duration 1302 is longer than the step duration 1304.

For simplicity, only 24 output current level steps corresponding to a range of multibit control words 000000b through 010111b are shown. In some embodiments, the number of output current level steps of the output curve is greater than 32. In some embodiments, the ratio in output current levels between adjacent output current level steps of the output curve is less than 15 percent. In some embodiments, the ratio in output current levels between adjacent output current level steps of the output curve is less than 12 percent.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A configuration circuit to obtain a digital code comprising:
    a controller circuit that generates a plurality of multibit control words;
    a digitally controlled current source circuit coupled to the controller circuit to receive a multibit control word generated by the controller circuit, the digitally controlled current source circuit generating an output current that corresponds to the multibit control word, wherein the output current corresponds to the multibit control word in accordance with a predetermined output curve;
    a test voltage node coupled to the digitally controlled current source circuit to receive the output current, whereby a test voltage develops in response to the output current;
    a reference voltage node that develops a reference voltage, the level of the reference voltage being independent of the multibit control word; and
    a voltage comparison circuit coupled to the test voltage node, the reference voltage node and the controller circuit;
    wherein the voltage comparison circuit (i) receives the test voltage and the reference voltage, (ii) compares the test voltage to the reference voltage to produce a comparison result and (iii) sends the comparison result to the controller circuit;
    wherein the digital code is obtained by the configuration circuit using the comparison result and the multibit control word;
    wherein the digitally controlled current source circuit comprises:
    a logarithmic digital-to-analog converter (DAC) circuit coupled to the controller circuit to receive a first portion of the multibit control word, the logarithmic DAC circuit generating a voltage based on the first portion of the multibit control word;
    a voltage-to-current converter circuit coupled to the logarithmic DAC circuit to receive the generated voltage, the voltage-to-current converter circuit controlling the level of a reference current based on the generated voltage; and
    a multiplying DAC circuit coupled to the controller circuit, the voltage-to-current converter circuit and the test voltage node; and
    wherein the multiplying DAC circuit (i) receives a second portion of the multibit control word from the controller circuit, (ii) generates the output current based on the second portion of the multibit control word and the reference current level and (iii) provides the output current to the test voltage node.

2. The configuration circuit of claim 1, wherein:
    the voltage comparison circuit (i) determines that the test voltage surpasses a threshold voltage range from the reference voltage and (ii) sends the comparison result to the controller circuit indicating that the test voltage surpasses the threshold voltage range from the reference voltage; and
    the controller circuit (i) receives the comparison result and (ii) uses the multibit control word value to set the digital code to a value that uniquely corresponds to that multibit control word value.

3. The configuration circuit of claim 1,
    wherein the voltage-to-current converter circuit utilizes an impedance that exhibits similar temperature variation to an impedance utilized to develop the reference voltage.

4. The configuration circuit of claim 1, wherein the voltage-to-current converter circuit comprises:
    an operational amplifier (op-amp) coupled to the logarithmic DAC circuit to receive the generated voltage at an input of the op-amp;
    a reference current resistance circuit coupled to a DC bias voltage; and
    a field-effect-transistor (FET) coupled to the op-amp, the reference current resistance circuit and the multiplying DAC;
    wherein the FET (i) receives an output voltage of the op-amp, (ii) provides a current to the reference current resistance circuit, (iii) receives the reference current from the multiplying DAC and (iv) provides a feedback voltage to another input of the op-amp;
    wherein the level of the current through the reference current resistance circuit is based on the generated voltage and the reference current resistance circuit;
    wherein the reference current level is the same as the level of the current through the reference current resistance circuit; and
    wherein the reference current resistance circuit has a temperature coefficient of resistance (TCR) that is lower than 50 ppm per degree Kelvin.

5. The configuration circuit of claim 4, further comprising:

a reference voltage circuit coupled to the reference voltage node, the reference voltage circuit developing the reference voltage at the reference voltage node;

wherein a resistance circuit of the reference voltage circuit has a TCR that is the same as the TCR of the reference current resistance circuit.

6. The configuration circuit of claim 4, further comprising:

a reference voltage DAC circuit coupled to the reference voltage node, the reference voltage DAC circuit developing the reference voltage at the reference voltage node;

wherein a resistance circuit of the reference voltage DAC circuit has a TCR that is the same as the TCR of the reference current resistance circuit.

7. The configuration circuit of claim 1, wherein:

the predetermined output curve is a curve of a non-linear function;

the predetermined output curve includes a plurality of output current level steps; and each output current level step uniquely corresponds with a respective value of the multibit control word generated by the controller circuit.

8. The configuration circuit of claim 7, wherein:

each output current level step has a corresponding step duration;

the corresponding step duration of each output current level step is less than 5 RC time constants greater than the minimum amount of time that the digitally controlled current source circuit will produce a current at that output current level; and the respective step duration of the output current level steps and the output current level of the output current level steps are inversely proportional.

9. The configuration circuit of claim 7, wherein:

the number of output current level steps of the output curve is greater than 32; and the ratio in output current levels between adjacent output current level steps of the output curve is less than 15 percent.

10. The configuration circuit of claim 7, wherein:

the number of output current level steps of the output curve is greater than 32; and the ratio in output current levels between adjacent output current level steps of the output curve is less than 12 percent.

11. The configuration circuit of claim 1, further comprising:

a second test voltage node, the second test voltage node providing a second test voltage; and a signal routing circuit coupled to the voltage comparison circuit;

wherein in a first routing configuration the signal routing circuit (i) couples the test voltage node to the digitally controlled current source circuit and (ii) couples the voltage comparison circuit to the test voltage node; and wherein in a second routing configuration the signal routing circuit (i) couples the second test voltage node to the digitally controlled current source circuit and (ii) couples the voltage comparison circuit to the second test voltage node.

12. The configuration circuit of claim 1, further comprising:

an external configuration resistor coupled to the test voltage node to receive the output current, the external configuration resistor developing the test voltage at the test voltage node in response to the output current.

13. A method for obtaining a digital code comprising:

receiving a multibit control word at a digitally controlled current source circuit;

generating an output current that corresponds to the multibit control word using the digitally controlled current source circuit, wherein the output current corresponds to the multibit control word in accordance with a predetermined output curve;

receiving the output current at a test voltage node, whereby a test voltage develops in response to the output current;

developing a reference voltage at a reference voltage node, the level of the reference voltage being independent of the multibit control word;

comparing the test voltage to the reference voltage using a voltage comparison circuit to produce a comparison result; and obtaining the digital code using the comparison result and the multibit control word;

wherein generating the output current that corresponds to the multibit control word using the digitally controlled current source circuit comprises:

generating a voltage based on a first portion of the multibit control word using a logarithmic digital-to-analog converter (DAC) circuit;

controlling the level of a reference current using a voltage-to-current converter circuit, wherein the reference current level is based on the generated voltage;

generating the output current based on a second portion of the multibit control word and the reference current level using a multiplying DAC circuit; and receiving the output current at the test voltage node.

14. The method of claim 13, further comprising:

determining that the test voltage surpasses a threshold voltage range from the reference voltage using the voltage comparison circuit; and setting, using the multibit control word value, the digital code to a value that uniquely corresponds to that multibit control word value.

15. The method of claim 13, wherein the voltage-to-current converter circuit utilizes an impedance that exhibits similar temperature variation to an impedance utilized to develop the reference voltage.

16. The method of claim 13, wherein controlling the level of a reference current using a voltage-to-current converter circuit comprises:

receiving the generated voltage at an input of an operational amplifier (op-amp) of the voltage-to-current converter circuit;

driving a field-effect-transistor (FET) of the voltage-to-current converter circuit using an output of the op-amp;

causing a first current to flow from the FET to a reference current resistance circuit of the voltage-to-current converter circuit, wherein the level of the first current is based on the generated voltage and the reference current resistance circuit;

receiving a feedback signal from the FET at another input of the op-amp; and causing a second current that is equal to the first current to flow from the multiplying DAC circuit to the FET;

wherein the second current is the reference current; and wherein the reference current resistance circuit has a temperature coefficient of resistance (TCR) that is lower than 50 ppm per degree Kelvin.

17. The method of claim 16, further comprising:
developing the reference voltage at the reference voltage node using a reference voltage circuit;
wherein a resistance circuit of the reference voltage circuit has a TCR that is the same as the TCR of the reference current resistance circuit.

18. The method of claim 16, further comprising:
developing the reference voltage at the reference voltage node using a reference voltage DAC circuit;
wherein a resistance circuit of the reference voltage DAC circuit has a TCR that is the same as the TCR of the reference current resistance circuit.

19. The method of claim 13, wherein:
the predetermined output curve is a curve of a non-linear function;
the predetermined output curve includes a plurality of output current level steps; and
each output current level step uniquely corresponds with a respective value of the multibit control word.

20. The method of claim 19, wherein:
each output current level step has a corresponding step duration;
the corresponding step duration of each output current level step is less than 5 RC time constants greater than the minimum amount of time that the digitally controlled current source circuit will produce a current at that output current level; and
the respective step duration of the output current level steps and the output current level of the output current level steps are inversely proportional.

21. The method of claim 19, wherein:
the number of steps in output current level of the output curve is greater than 32; and
the ratio in output current level between adjacent steps of the output curve is less than 15 percent.

22. The method of claim 19, wherein:
the number of steps in output current level of the output curve is greater than 32; and
the ratio in output current level between adjacent steps of the output curve is less than 12 percent.

23. The method of claim 13, further comprising:
in a first routing mode of a signal routing circuit: (i) coupling the test voltage node to the digitally controlled current source circuit to receive the output current at the test voltage node and (ii) coupling the voltage comparison circuit to the test voltage node to receive the test voltage from the test voltage node; and
in a second routing mode of the signal routing circuit: (i) coupling a second test voltage node to the digitally controlled current source circuit to receive the output current at the second test voltage node and (ii) coupling the voltage comparison circuit to the second test voltage node to receive a second test voltage from the second test voltage node.

* * * * *